(12) United States Patent
Hwang et al.

(10) Patent No.: US 11,562,777 B2
(45) Date of Patent: Jan. 24, 2023

(54) DATA INPUT BUFFER AND SEMICONDUCTOR APPARATUS INCLUDING THE SAME

(71) Applicant: SK hynix Inc., Icheon-si (KR)

(72) Inventors: Jin Ha Hwang, Icheon-si (KR); Yo Han Jeong, Icheon-si (KR); Keun Seon Ahn, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/228,349

(22) Filed: Apr. 12, 2021

(65) Prior Publication Data

US 2022/0122644 A1 Apr. 21, 2022

(30) Foreign Application Priority Data

Oct. 19, 2020 (KR) .................. 10-2020-0135318

(51) Int. Cl.
*G11C 7/10* (2006.01)
(52) U.S. Cl.
CPC .......... *G11C 7/1084* (2013.01); *G11C 7/1057* (2013.01)

(58) Field of Classification Search
CPC . G11C 7/1084; G11C 7/1057; G11C 29/1201; G11C 1029/0409; G11C 7/20; G11C 29/022; G11C 29/028
USPC .................................................. 365/189.02
See application file for complete search history.

(56) References Cited

U.S. PATENT DOCUMENTS

2015/0346274 A1* 12/2015 Gorman ............. G01R 31/2856
324/762.03

FOREIGN PATENT DOCUMENTS

KR 101806817 B1 12/2017
KR 1020190017112 A 2/2019

* cited by examiner

*Primary Examiner* — Huan Hoang
(74) *Attorney, Agent, or Firm* — William Park & Associates Ltd.

(57) ABSTRACT

A semiconductor apparatus includes a data input buffer configured to generate write data by receiving data that is input through a data input/output unit during a write operation section and configured to generate an output level detection signal by detecting a voltage level of the data I/O unit during a read operation section.

19 Claims, 7 Drawing Sheets

DATA INPUT BUFFER AND SEMICONDUCTOR APPARATUS INCLUDING THE SAME

CROSS-REFERENCES TO RELATED APPLICATION

The present application claims priority under 35 U.S.C. § 119(a) to Korean application number 10-2020-0135318, filed on Oct. 19, 2020, in the Korean Intellectual Property Office, which is incorporated herein by reference in its entirety.

BACKGROUND

1. Technical Field

Various embodiments may generally relate to a semiconductor circuit, and more particularly, to a data input buffer and a semiconductor apparatus including the same.

2. Related Art

Semiconductor apparatuses include data buffers configured to output data to the outside of the semiconductor apparatuses or input data from the outside of the semiconductor apparatuses.

Characteristics of data output from data buffers may depend on impedance control methods of the data buffers, and thus there is a need for a method for more efficiently and accurately controlling impedance.

SUMMARY

In an embodiment of the present disclosure, a semiconductor apparatus may include: a data input buffer configured to generate write data by receiving data that is input through a data input/output unit during a write operation section of the semiconductor apparatus and configured to generate an output level detection signal by detecting a voltage level of the data I/O unit during a read operation section of the semiconductor apparatus.

In an embodiment of the present disclosure, a semiconductor apparatus may include a data input buffer which includes a first multiplexer configured to select one of a first reference voltage and a second reference voltage based on a data output enable signal and configured to output the selected reference voltage; and a first buffer configured to output write data by comparing a voltage level of a data input/output unit to a voltage level of the reference voltage that is output from the first multiplexer during an activation section of a data input enable signal and configured to output a first output level detection signal by comparing the voltage level of the data I/O unit to the voltage level of the reference voltage that is output from the first multiplexer during an activation section of the data output enable signal.

In an embodiment of the present disclosure, a semiconductor apparatus may include: a data input buffer configured to generate write data by receiving data that is input through a data input/output unit during a write operation section and configured to generate first and second output level detection signals by detecting a voltage level of the data I/O unit during a read operation section; an impedance adjustment circuit configured to perform an impedance adjustment operation that adjusts at least one value of the first and second impedance adjustment signals based on an impedance of an external resistor based on an impedance adjustment command during an initialization section and configured to perform an impedance readjustment operation that readjusts at least one value of the first and second impedance adjustment signals based on the first and second output level detection signals during the read operation section; and a data output buffer configured to output read data through the data I/O unit by driving the read data with an output impedance that is determined based on the first and second impedance adjustment signals.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present teachings are described in detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of idealized embodiments of the present teachings. However, embodiments of the present teachings should not be construed as limiting the present teachings. Although a few embodiments of the present teachings are shown and described, it will be appreciated by those of ordinary skill in the art that changes may be made in these embodiments without departing from the principles and spirit of the present teachings.

Embodiments are provided to a data input buffer capable of improving output data characteristics and a semiconductor apparatus including the same.

Figure 1:
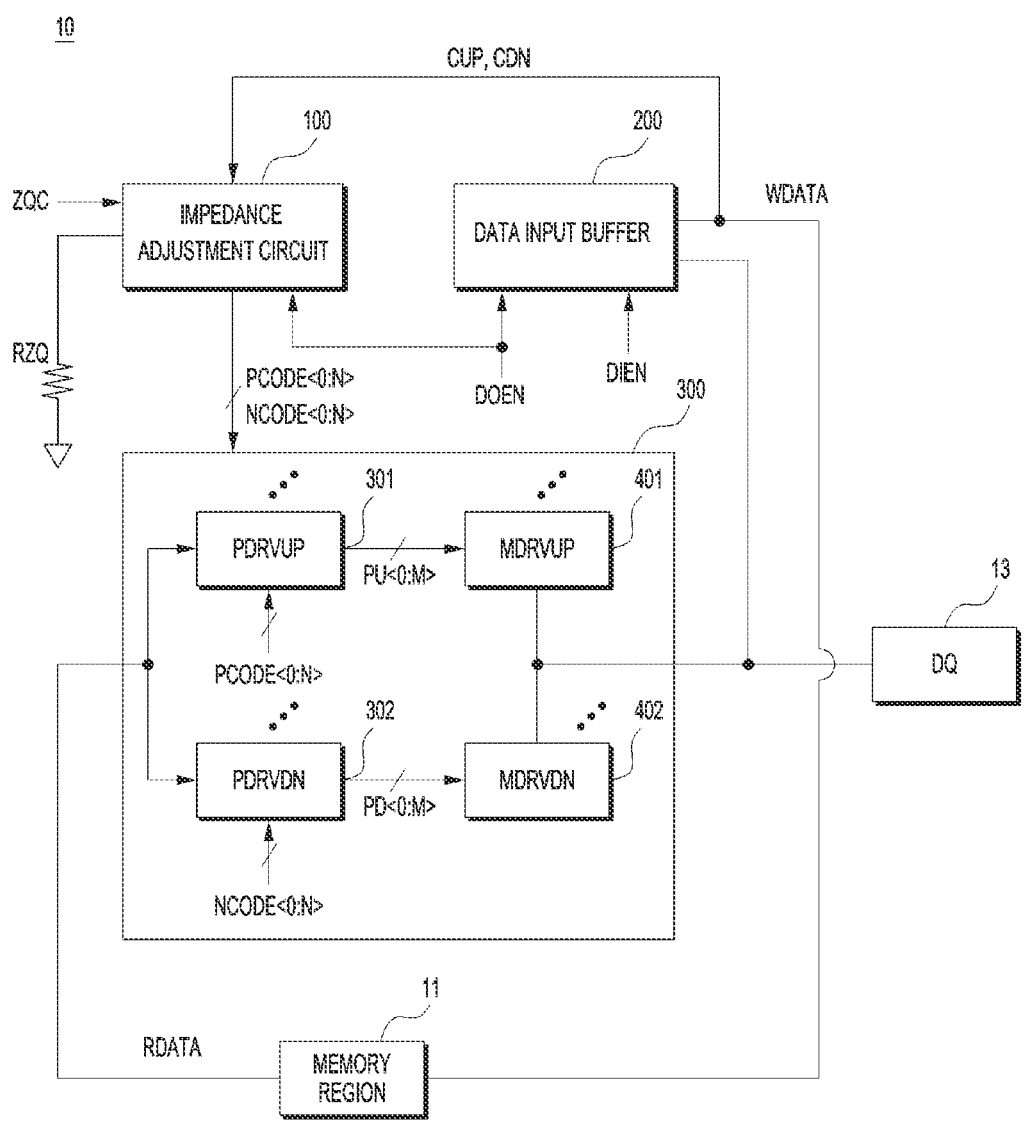
FIG. 1 is a diagram illustrating a configuration of a semiconductor apparatus according to an embodiment of the present disclosure.

FIG. 1 is a diagram illustrating a configuration of a semiconductor apparatus 10 according to an embodiment of the present disclosure.

Referring to FIG. 1, the semiconductor apparatus 10 may include a memory region 11, a data input/output unit 13, an impedance adjustment circuit 100, a data input buffer 200, and a data output buffer 300.

The memory region 11 may output read data RDATA based on a read command and store write data WDATA input based on a write command. The memory region 11 may block an input of the write data WDATA to the memory region 11 according to the read command. The read data RDATA and the write data WDATA may include a plurality of data bits respectively. The data input/output unit 13 may include a plurality of data input/output pads.

Data input and output between the semiconductor apparatus 10 and an external system of the semiconductor apparatus 10 (for example, a memory controller) may be accomplished through the data I/O unit 13.

The impedance adjustment circuit 100 may perform an impedance adjustment operation that adjusts at least one value of first and second impedance adjustment signals PCODE<0:N> and NCODE<0:N> based on an impedance of an external resistor RZQ based on an impedance adjust command ZQC during a first section.

The impedance adjustment circuit 100 may perform the impedance adjustment operation that adjusts the at least one value of the first and second impedance adjustment signals PCODE<0:N> and NCODE<0:N> based on the impedance adjustment command ZQC during the first section so that an output impedance of the semiconductor apparatus 10 coincides with the impedance of the external resistor RZQ.

The first section may be determined based on the impedance adjustment command ZQC.

The impedance adjustment section may be included in a separate section from a read operation section and a write operation section of the semiconductor apparatus 10, for example, an initialization section.

The impedance adjustment circuit 100 may perform an impedance readjustment operation that readjusts at least one value of the first and second impedance adjustment signals PCODE<0:N> and NCODE<0:N> based on a data output enable signal DOEN and first and second output level detection signals CDN and CUP during a second section.

The second section may be an activation section of the data output enable signal DOEN and may be included in the read operation section of the semiconductor apparatus 10.

The data input buffer 200 may generate the write data WDATA by receiving data that is input through the data I/O unit 13 during the write operation section of the semiconductor apparatus 10.

The data input buffer 200 may generate the write data WDATA by receiving the data that is input through the data I/O unit 13 during an activation section of a data input enable signal DIEN.

The activation section of the data input enable signal DIEN may be included in the write operation section of the semiconductor apparatus 10.

The data input buffer 200 may generate the first and second output level detection signals CDN and CUP by detecting a voltage level of the data I/O unit 13 during the read operation section of the semiconductor apparatus 10.

The data input buffer 200 may generate the first and second output level detection signals CDN and CUP by detecting the voltage level of the data I/O unit 13 during the activation section of the data output enable signal DOEN.

An output impedance of the data output buffer 300 may be varied based on the first and second impedance adjustment signals PCODE<0:N> and NCODE<0:N>, and the data output buffer 300 may output the read data RDATA through the data I/O unit 13 by driving the read data RDATA with the output impedance that is determined based on the first and second impedance adjustment signals PCODE<0:N> and NCODE<0:N>.

The data output buffer 300 may include a plurality of pre-pull-up drivers (PDRVUP) 301, a plurality of pre-pull-down drivers (PDRVDN) 302, a plurality of main pull-up drivers (MDRVUP) 401, and a plurality of main pull-down drivers (MDRVDN) 402.

The plurality of pre-pull-up drivers 301 may generate a pull-up control signal PU<0:M> by driving the read data RDATA based on the first impedance adjustment signal PCODE<0:N>.

The plurality of pre-pull-down drivers 302 may generate a pull down control signal PD<0:M> by driving the read data RDATA based on the second impedance adjustment signal NCODE<0:N>.

The plurality of main pull-up drivers 401 may drive the data I/O unit 13 with an impedance that is determined based on the pull-up control signal PU<0:M>.

The plurality of main pull-down drivers 402 may drive the data I/O unit 13 with an impedance that is determined based on the pull-down control signal PD<0:M>.

Figure 2:
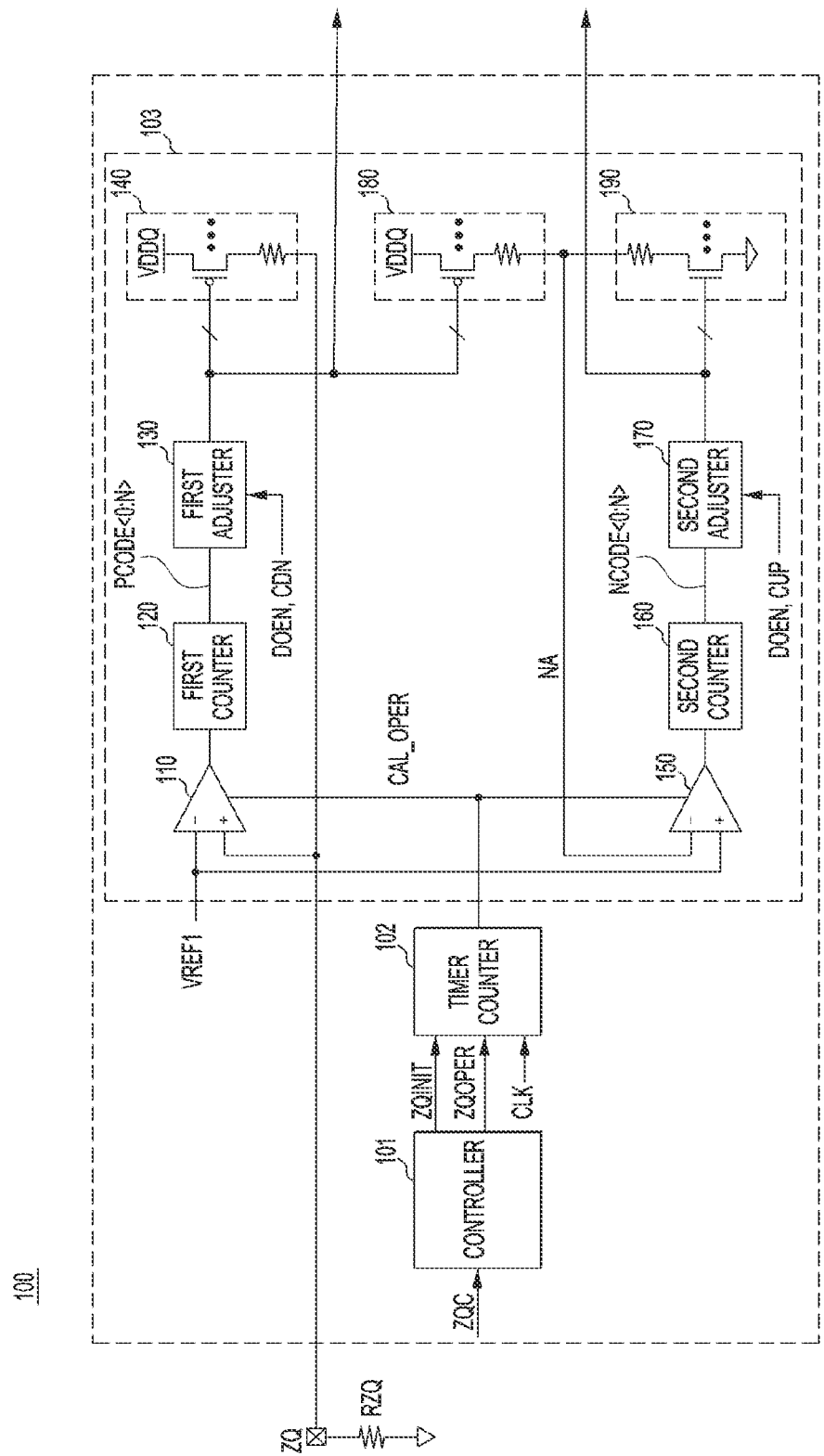
FIG. 2 is a diagram illustrating a configuration of an impedance adjustment circuit of FIG. 1.

FIG. 2 is a diagram illustrating a configuration of the impedance adjustment circuit 100 of FIG. 1.

Referring to FIG. 2, the impedance adjustment circuit 100 may include a controller 101, a timer counter 102, and an impedance adjustment signal generator 103.

The controller 101 may generate a plurality of internal commands ZQINIT and ZQOPER, which define the performing of the impedance adjustment operation, in response to the impedance adjustment command ZQC.

According to operation standards of semiconductor memories that are related to impedance adjustment, the impedance adjustment command ZQC may be generated by a combination of control signals, such as a chip enable signal/CS, a row address strobe signal/RAS, a column address strobe signal/CAS, and a write enable signal/WE.

The time counter 102 may generate an operation control signal CAL_OPER, which sets impedance adjustment operation times corresponding to the plurality of internal commands ZQINIT and ZQOPER, by using a clock signal CLK.

The impedance adjustment signal generator 103 may operate during a time that is determined by the operation control signal CAL_OPER to generate the first and second impedance adjustment signals PCODE<0:N> and NCODE<0:N>.

The impedance adjustment signal generator 103 may include a first comparator 110, a first counter 120, a first adjuster 130, a first digital-analog converter (DAC) 140, a second comparator 150, a second counter 160, a second adjuster 170, a second DAC 180, and a third DAC 190.

The first comparator 110 may compare a first reference voltage VREF1 and a voltage of a first node and may output a comparison result during an activation section of the operation control signal CAL_OPER based on the impedance adjustment command ZQC. The first node may be coupled to an external resistor pad ZQ.

The first counter 120 may adjust the value of the first impedance adjustment signal PCODE<0:N> by performing up/down counting based on an output of the first comparator 110.

The first adjuster 130 may readjust the value of the first impedance adjustment signal PCODE<0:N> based on the data output enable signal DOEN and the first output level detection signal CDN.

The first DAC 140 may convert the digital code type of the first impedance adjustment signal PCODE<0:N> to an analog voltage level and may apply the analog voltage level to the first node.

The first DAC 140 may include a resistor and a plurality of PMOS transistors that are coupled between a power voltage VDDQ terminal and one terminal of the resistor, in common. The other terminal of the resistor may be coupled to the external resistor pad ZQ.

The first DAC 140 may include a circuit configuration in which the plurality of main pull-up drivers 401 of the data output buffer 300 are duplicated.

The first DAC 140 may be coupled to the external resistor RZQ through the external resistor pad ZQ.

The second comparator 150 may compare the first reference voltage VREF1 and a voltage of a second node NA and may output a comparison result during the activation section of the operation control signal CAL_OPER based on the impedance adjustment command ZQC.

The second counter 160 may adjust the value of the second impedance adjustment signal NCODE<0:N> by performing up/down counting based on an output of the second comparator 150.

The second adjuster 170 may readjust the value of the second impedance adjustment signal NCODE<0:N> based on the data output enable signal DOEN and the second output level detection signal CUP.

The second DAC 180 may convert the digital code type of the first impedance adjustment signal PCODE<0:N> to an analog voltage level and may apply the analog voltage level to the second node NA.

The second DAC 180 may include a resistor and a plurality of PMOS transistors that are coupled between the power voltage VDDQ terminal and one terminal of the resistor in common. The other terminal of the resistor may be coupled to the second node NA.

The second DAC 180 may include a circuit configuration in which the plurality of main pull-up drivers 401 of the data output buffer 300 are duplicated.

The third DAC 190 may convert the digital code type of the second impedance adjustment signal NCODE<0:N> to an analog voltage level and may apply the analog voltage level to the second node NA.

The third DAC 190 may include a resistor and a plurality of NMOS transistors that are coupled between a ground terminal and one terminal of the resistor in common. The other terminal of the resistor may be coupled to the second node NA.

The third DAC 190 may include a circuit configuration in which a plurality of main pull-down drivers 402 of the data output buffer 300 are duplicated.

Figure 3:
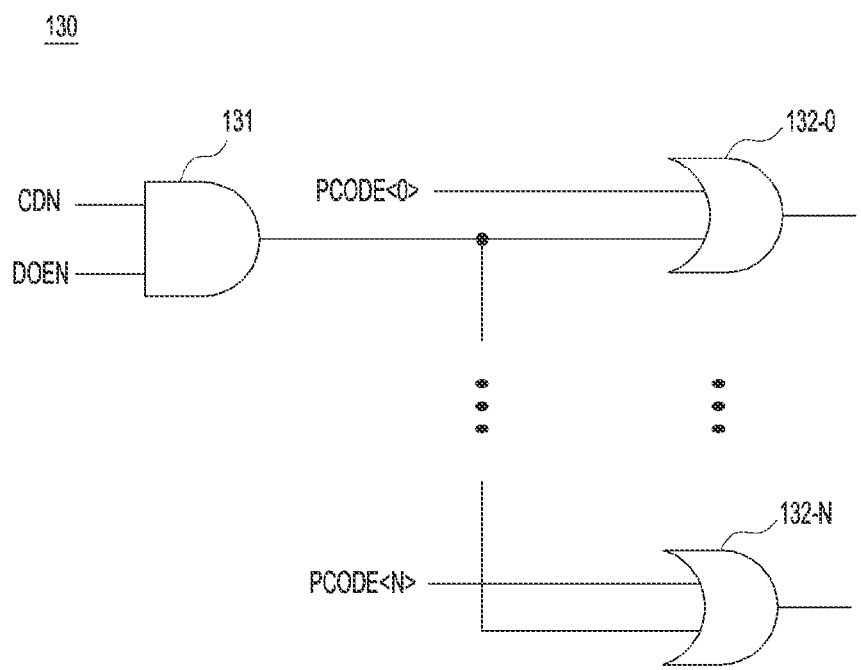
FIG. 3 is a diagram illustrating a configuration of a first adjuster of FIG. 2

FIG. 3 is a diagram illustrating a configuration of the first adjuster 130 of FIG. 2.

Referring to FIG. 3, the first adjuster 130 may include a first logic gate 131 and a plurality of second logic gates 132-0 to 132-N.

The first logic gate 131 may perform a logic AND operation on the data output enable signal DOEN and the first output level detection signal CDN and may output a logic AND operation result.

The plurality of second logic gates 132-0 to 132-N may perform logic OR operations on signal bits of the first impedance adjustment signal PCODE<0:N> and an output signal of the first logic gate 131, bit by bit, and may output logic OR operation results.

When both the data output enable signal DOEN and the first output level detection signal CDN are activation levels, for example, logic high, the first adjuster 130 may output all the signal bits of the first impedance adjustment signal PCODE<0:N> as logic high, irrespective of the original values of the signal bits of the first impedance adjustment signal PCODE<0:N>.

Figure 4:
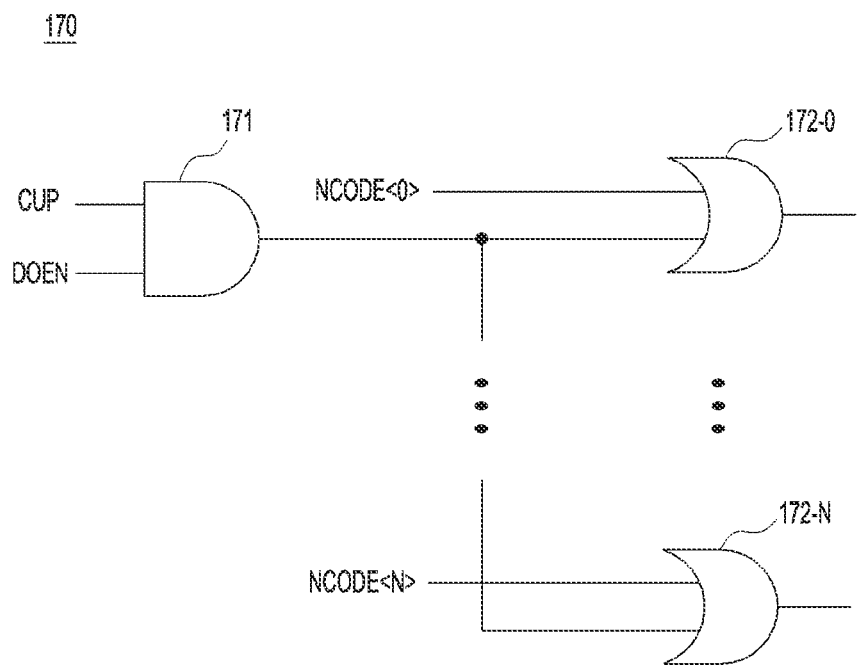
FIG. 4 is a diagram illustrating a configuration of a second adjuster of FIG. 2.

FIG. 4 is a diagram illustrating a configuration of the second adjuster 170 of FIG. 2.

Referring to FIG. 4, the second adjuster 170 may include a first logic gate 171 and a plurality of second logic gates 172-0 to 172-N.

The first logic gate 171 may perform a logic AND operation on the data output enable signal DOEN and the second output level detection signal CUP and may output a logic AND operation result.

The plurality of second logic gates 172-0 to 172-N may perform logic OR operations on signal bits of the second impedance adjustment signal NCODE<0:N> and an output signal of the first logic gate 171, bit by bit, and may output logic OR operation results.

When the data output enable signal DOEN and the second output level detection signal CUP are activation levels, for example, logic high, the second adjuster 170 may output all the signal bits of the second impedance adjustment signal NCODE<0:N> as logic high, irrespective of the original values of the signal bits of the second impedance adjustment signal NCODE<0:N>.

Figure 5:
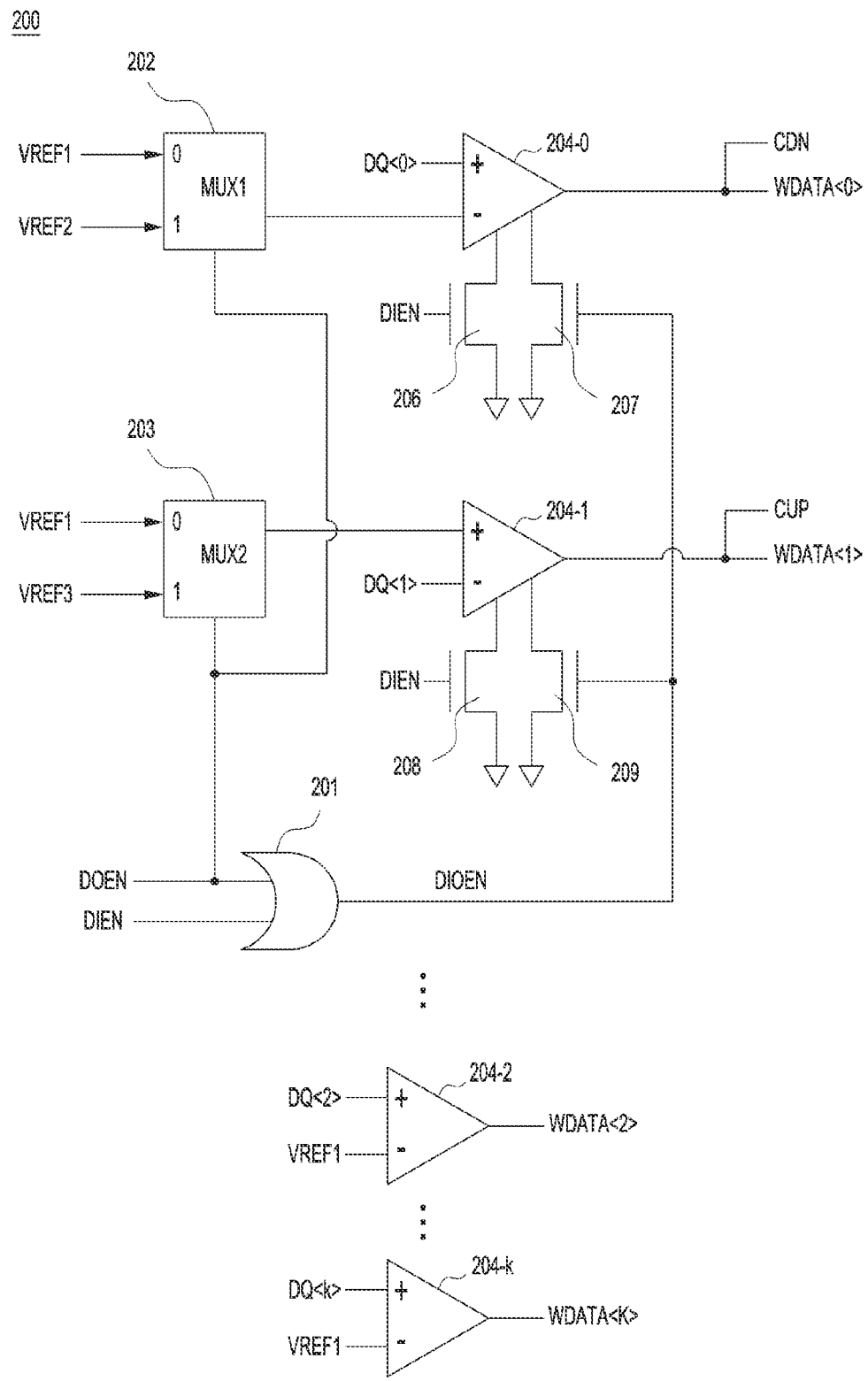
FIG. 5 is a diagram illustrating a configuration of an data input buffer of FIG. 1.

FIG. 5 is a diagram illustrating a configuration of the data input buffer 200 of FIG. 1.

Referring to FIG. 5, the data input circuit 200 may include a logic gate 201, a first multiplexer 202, a second multiplexer 203, a plurality of buffers 204-0-204-k, and first to fourth switches 206 to 209. An embodiment of the present invention according to the FIG. 5 is a configuration example of a part of the plurality of buffers, for example, a first buffer (204-0) and a second buffer (204-1) to perform an original operation (data write operation) and to perform an additional operation (generating a first and a second output level detection signals CDN, CUP. The rest buffers (204-2-204-K) may perform only the data write operation.

The logic gate 201 may perform a logic OR operation on the data output enable signal DOEN and the data input enable signal DIEN and may output a logic OR operation result as a data I/O enable signal DIOEN.

The first multiplexer 202 may select one of the first reference voltage VREF1 and a second reference voltage VREF2 based on the data output enable signal DOEN and may output the selected reference voltage.

The first multiplexer 202 may select the first reference voltage VREF1 of the first reference voltage VREF1 and the second reference voltage VREF2 when the data output enable signal DOEN is at a low level and may output the selected first reference voltage VREF1.

The first multiplexer 202 may select the second reference voltage VREF2 of the first reference voltage VREF1 and the second reference voltage VREF2 when the data output enable signal DOEN is at a high level and may output the selected second reference voltage VREF2.

The second multiplexer 203 may select one of the first reference voltage VREF1 and a third reference voltage VREF3 based on the data output enable signal DOEN and may output the selected reference voltage.

For example, the voltage level of the first reference voltage VREF1 may be a value that corresponds to a half of the power voltage VDDQ, for example, 0.5 VDDQ.

The voltage level of the second reference voltage VREF2 may be at a higher value than the first reference voltage VREF1, for example, 0.65 VDDQ.

The voltage level of the third reference voltage VREF3 may be at a lower level than the first reference voltage VREF1, for example, 0.35 VDDQ.

The above-described voltage levels of the first to third reference voltages VREF1 to VREF3 are exemplary. The voltage levels of the first to third reference voltages VREF1 to VREF3 may be adjusted within a range that satisfies the condition that the second reference voltage VREF2 has a higher voltage level than the first reference voltage VREF1, and the third reference voltage VREF3 has a lower voltage level than the first reference voltage VREF1.

The second multiplexer 203 may select the first reference voltage VREF1 of the first reference voltage VREF1 and the third reference voltage VREF3 when the data output enable signal DOEN is at a low level and may output the selected first reference voltage VREF1.

The second multiplexer 203 may select the third reference voltage VREF3 of the first reference voltage VREF1 and the third reference voltage VREF3 when the data output enable signal DOEN is at a high level and may output the selected third reference voltage VREF3.

The first buffer 204-0 may compare the voltage level of the data I/O unit 13 and a voltage level of an output signal that is output from the first multiplexer 202 and may perform an operation of outputting a comparison result as the write data WDATA and perform an operation of outputting the comparison result as the first output level detection signal CDN.

During the write operation section (DOEN=L and DIEN=H) of the semiconductor apparatus 10, the first buffer 204-0 may output the write data WDATA with a high level when the voltage level of the data I/O unit 13 is higher than the first reference voltage VREF1 and may output the write data WDATA with a low level when the voltage level of the data I/O unit 13 is lower than the first reference voltage VREF1.

During the read operation section (DOEN=H and DIEN=L) of the semiconductor apparatus 10, the first buffer 204-0 may output the first output level detection signal CDN with a high level when the voltage level of the data I/O unit 13 is higher than the second reference voltage VREF2 and may output the first output level detection signal CDN with a low level when the voltage level of the data I/O unit 13 is lower than the second reference voltage VREF2.

The second buffer 204-1 may compare the voltage level of the output signal that is output from the second multiplexer 203 and the voltage level of the data I/O unit 13 and may perform a operation of output a comparison result as the write data WDATA perform a operation of output the comparison result as the second output level detection signal CUP.

During the write operation section (DOEN=L and DIEN=H) of the semiconductor apparatus 10, the second buffer 204-1 may output the write data WDATA with a high level when the voltage level of the data I/O unit 13 is higher than the first reference voltage VREF1 and may output the write data WDATA with a low level when the voltage level of the data I/O unit 13 is lower than the first reference voltage VREF1.

During the read operation section (DOEN=H and DIEN=L) of the semiconductor apparatus 10, the second buffer 204-1 may output the second output level detection signal CUP with a high level when the voltage level of the third voltage level VREF3 is higher than the voltage level of the data I/O unit 13 and may output the second output level detection signal CUP with a low level when the voltage level of the third voltage level VREF3 is lower than the voltage level of the data I/O unit 13.

The first switch 206 may couple or separate a first current path of the first buffer 204-0 based on the data input enable signal DIEN.

The second switch 207 may couple or separate a second current path of the first buffer 204-0 based on the data I/O enable signal DIOEN.

Since both the data input enable signal DIEN and the data I/O enable signal DIOEN have a high level in a data write operation, both the first switch 206 and the second switch 207 may turn on.

A current amount when both the first switch 206 and the second switch 207 turn on to couple the first current path and the second current path of the first buffer 204-0 may be equal to the first current amount, for example, a target current amount that is set to be suitable for the data write operation.

In a data read operation, since the data input enable signal DIEN has a low level and the data I/O enable signal DIOEN has a high level, the first switch 206 may turn off and the second switch 207 may turn on.

A second current amount when only the second switch 207 of the first switch 206 and the second switch 207 turns on to couple the second current path of the first buffer 204-0 may be lower than the first current amount.

The first buffer 204-0 may perform the data write operation, which is an original operation, and an additional operation, which is an output level detection operation for generating the first output level detection signal CDN, which is performed in the data read operation section.

The first buffer 204-0 may be designed to operate by using the first current amount in the data write operation and may operate by using a second current amount (a relatively small current amount compared to the first current amount) in the output level detection operation.

The third switch 208 may couple or separate a first current path of the second buffer 204-1 based on the data input enable signal DIEN.

The fourth switch 209 may couple or separate a second current path of the second buffer 204-1 based on the data I/O enable signal DIEON.

Since both the data input enable signal DIEN and the data I/O enable signal DIOEN have a high level in the data write operation, both the third switch 208 and the fourth switch 209 may turn on.

A current amount when both the third switch 208 and the fourth switch 209 turn on to couple the first current path and the second current path of the second buffer 204-1 may be equal to the first current amount, for example, the target current amount that is set to be suitable for the data write operation.

In the data read operation, since the data input enable signal DIEN has a low level and the data I/O enable signal DIOEN has a high level, the third switch 208 may turn off and the fourth switch 209 may turn on.

A second current amount when only the fourth switch 209 of the third switch 208 and the fourth switch 209 turns on to couple the second current path of the second buffer 204-1 may be lower than the first current amount.

The second buffer 204-1 may perform the data write operation, which is an original operation, and an additional operation, which is an output level detection operation for generating the second output level detection signal CUP, which is performed in the data read operation section.

The second buffer 204-1 may be designed to operate by using the first current amount in the data write operation and may operate by using a relatively small current amount (for example, second current amount) in the output level detection operation.

Figure 6:
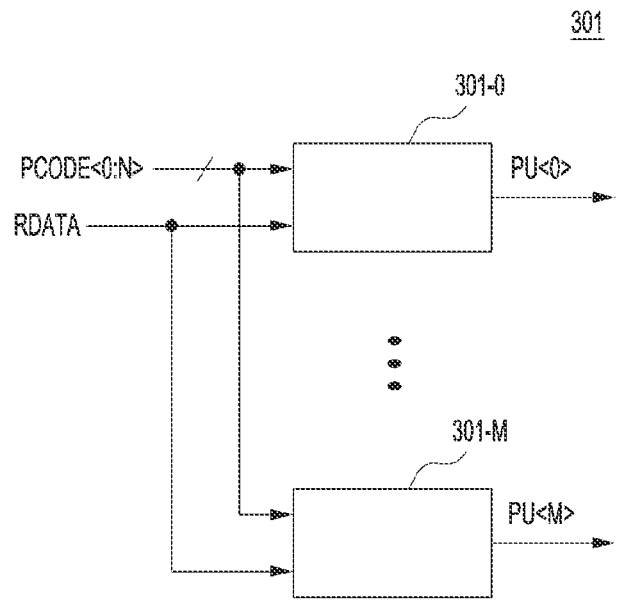
FIG. 6 is a diagram illustrating a configuration of a pre-pull-up driver of FIG. 1.

FIG. 6 is a diagram illustrating a configuration of the pre-pull-up driver (PDRVUP) 301 of FIG. 1.

Referring to FIG. 6, the pre-pull-up driver 301 may include a plurality of pre-pull-up driving circuits 301-0 to 301-M.

The plurality of pre-pull-up driving circuits 301-0 to 301-M may generate, respectively, signal bits PU<0> to PU<M> constituting the pull-up control signal PU<0:M> by driving the read data RDATA based on the first impedance adjustment signal PCODE<0:N>.

Figure 7:
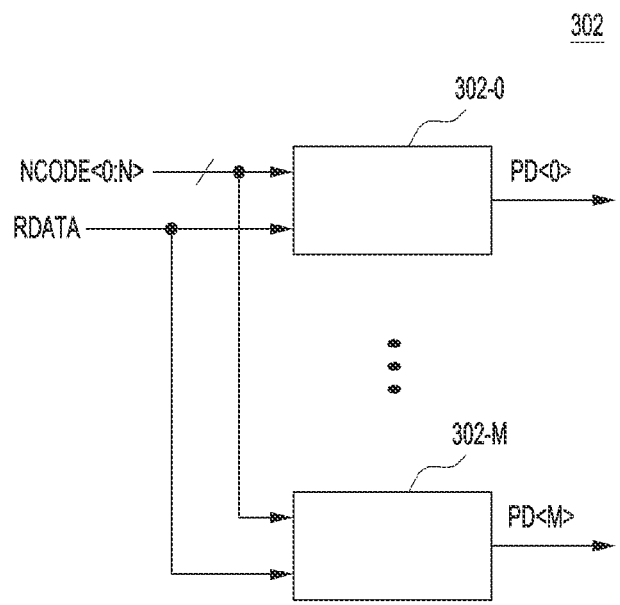
FIG. 7 is a diagram illustrating a configuration of a pre-pull-down driver of FIG. 1.

FIG. 7 is a diagram illustrating a configuration of a pre-pull-down driver (PDRVDN) 302 of FIG. 1.

Referring to FIG. 7, the pre-pull-down driver 302 may include a plurality of pre-pull-down driving circuits 302-0 to 302-M.

The plurality of pre-pull-down driving circuits 302-0 to 302-M may generate, respectively, signal bits PD<0> to PD<M> constituting the pull-down control signal PD<0:M> by driving the read data RDATA based on the second impedance adjustment signal NCODE<0:N>.

Figure 8:
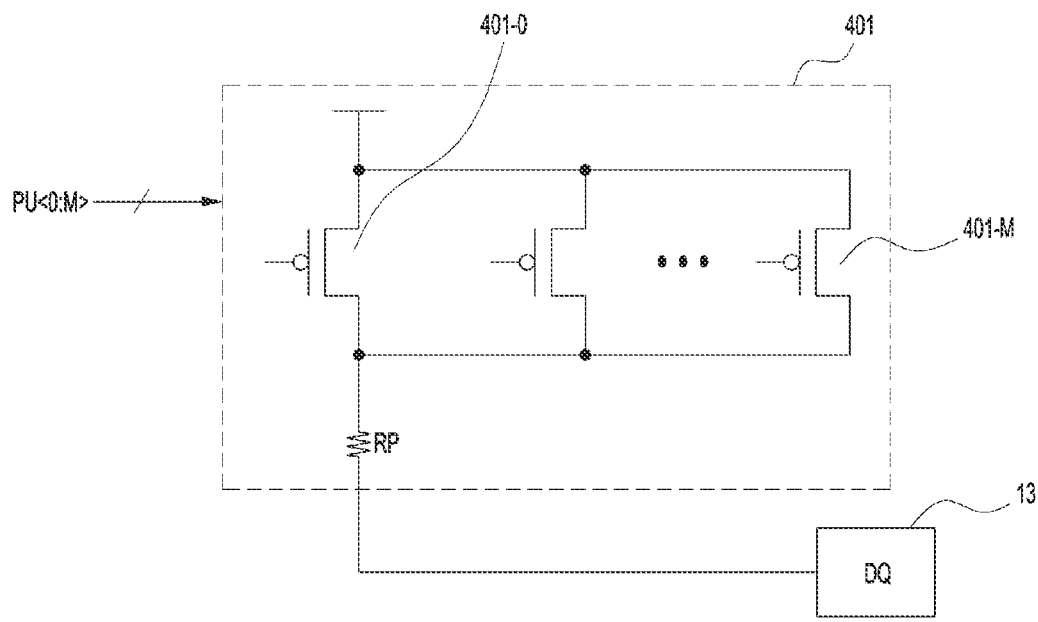
FIG. 8 is a diagram illustrating a configuration of a main pull-up driver of FIG. 1.

FIG. 8 is a diagram illustrating a configuration of a main pull-down driver (MDRVUP) 401 of FIG. 1.

Referring to FIG. 8, the main pull-up driver 401 may include a plurality of transistors 401-0 to 401-M and a resistor RP.

Source terminals of the plurality of transistors 401-0 to 401-M may be coupled to a power voltage terminal, in common, drain terminals thereof may be coupled to one terminal of the resistor RP, in common, and gates thereof may receive the plurality of signal bits of the pull-up control signal PU<0:M>, bit by bit.

The other terminal of the resistor RP may be coupled to the data I/O unit 13.

As the number of signal bits with a high level in the pull-up control signal PU<0:M> is increased, an output impedance of the output buffer 300 may be increased, and as the number of signal bits with a low level in the pull-up control signals PU<0:M> is increased, the output impedance of the output buffer 300 may be reduced.

Figure 9:
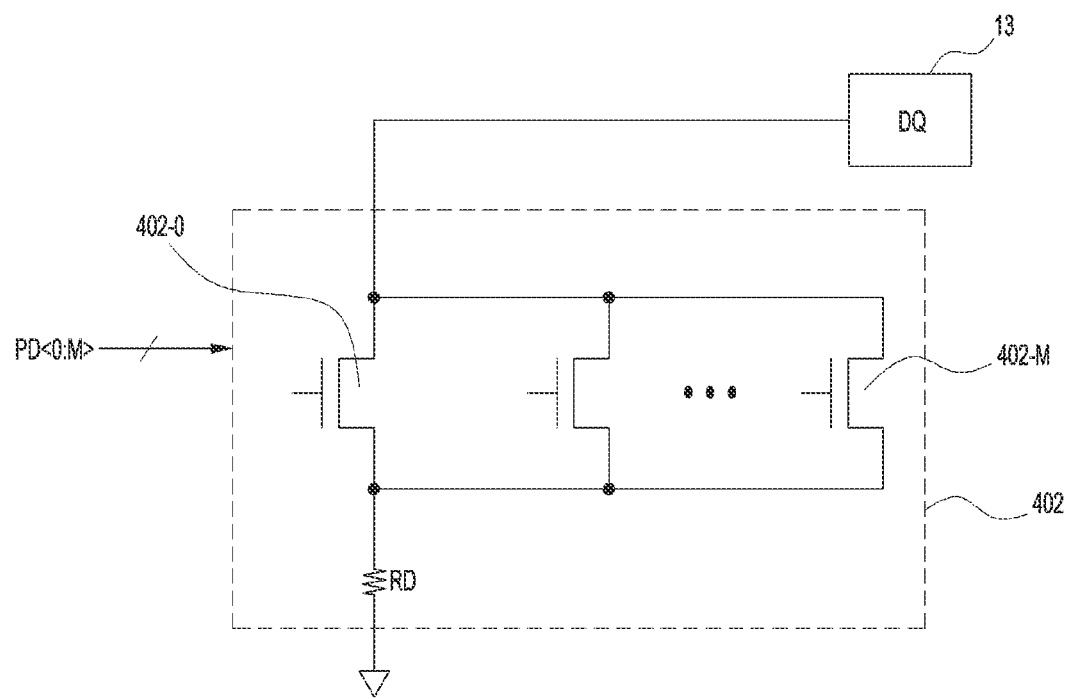
FIG. 9 is a diagram illustrating a configuration of a main pull-down driver of FIG. 1.

FIG. 9 is a diagram illustrating a configuration of a main pull-down driver (MDRVDN) 402 of FIG. 1.

Referring to FIG. 9, the main pull-down driver 402 may include a plurality of transistors 402-0 to 402-M and a resistor RD.

Drain terminals of the plurality of transistors 402-0 to 402-M may be coupled to the data I/O unit 13, in common, source terminals thereof may be coupled to one terminal of the resistor RD, in common, and gates thereof may receive the plurality of signal bits of the pull-down control signal PD<0:M>, bit by bit.

The other terminal of the resistor RD may be coupled to a ground terminal.

As the number of signal bits with a high level in the pull-down control signal PD<0:M> is increased, the output impedance of the output buffer 300 may be increased, and as the number of signal bits with a low level in the pull-down control signal PD<0:M> is increased, the output impedance of the output buffer 300 may be reduced.

An operation of the semiconductor apparatus 10 with the above-described configuration according to an embodiment will be described below.

First, an impedance adjustment operation performed during the first section that is included in the initialization process of the semiconductor apparatus 10 will be described below.

Since both the data input enable signal DIEN and the data output enable signal DOEN have a low level in the initialization process of the semiconductor apparatus 10, the operation of the data input buffer 200 may be stopped.

As the impedance adjustment command ZQC is input in the first section, the operation control signal CAL_OPER may be activated.

Since the operation control signal CAL_OPER is activated, the first and second comparators 110 and 150 and the first and second counter 120 and 160 may operate.

The impedance adjustment circuit 100 may adjust the value of the first impedance adjustment signal PCODE<0:N> so that the voltage level to which the digital code type of the first impedance adjustment signal PCODE<0:N> is converted through the first DAC 140, for example, the voltage of the first node coincides with the first reference voltage VREF1.

In a state that the first impedance adjustment signal PCODE<0:N> is input to the second DAC 180, the impedance adjustment circuit 100 may adjust the value of the second impedance adjustment signal NCODE<0:N> so that the voltage level to which the digital code type of the second impedance adjustment signal NCODE<0:N> is converted through the third DAC 190, for example, the voltage of the second node NA coincides with the first reference voltage VREF1.

The impedance adjustment signals PCODE<0:N> and NCODE<0:N> to which impedance adjustment is completed through the above-described process may be provided to the data output buffer 300 so that the output impedance of the data output buffer 300 may coincide with the impedance of the external resistor RZQ.

Next, the data write operation of the semiconductor apparatus 10 will be described below.

During the write operation section of the semiconductor apparatus 10, the impedance adjustment command ZQC might not be input, the operation control signal CAL_OPER may be deactivated, the data input enable signal DIEN may be activated to a high level, and the data output enable signal DOEN may be deactivated to a low level.

Since the operation control signal CAL_OPER is deactivated, operations of the first and second comparators 110 and 150 and the first and second counters 120 and 160 may be stopped.

Since the data output enable signal DOEN is at a low level, the values of the first and second impedance adjustment signals PCODE<0:N> and NCODE<0:N> may be maintained as values that are adjusted in a previous impedance adjustment operation as described above with reference to FIGS. 3 and 4.

The data input buffer 200 may generate the write data WDATA by receiving data that is input through the data I/O unit 13 from a device outside of the semiconductor apparatus 10.

Since the data output enable signal DOEN is at a low level, the data input buffer 200 may generate the write data WDATA by comparing the voltage level of the data I/O unit 13 and the first reference voltage VREF1.

As described above with reference to FIG. 5, since the data input enable signal DIEN is at a high level, the data input buffer 200 may perform the write data WDATA generation operation by using the first current amount.

Next, the impedance readjustment operation to be performed in the second section that is included in the read operation section of the semiconductor apparatus 10 will be described below.

During the read operation section of the semiconductor apparatus 10, the impedance adjustment command ZQC might not be input, the operation control signal CAL_OPER may be deactivated, the data input enable signal DIEN may be deactivated to a low level, and the data output enable signal DOEN may be activated to a high level.

Since the operation control signal CAL_OPER is deactivated, operations of the first and second comparators 110 and 150 and the first and second counters 120 and 160 may be stopped.

The data output buffer 300 may output the read data RDATA through the data I/O pad 13 by driving the read data RDATA with an output impedance that corresponds to the first and second impedance adjustment signals PCODE<0:N> and NCODE<0:N>.

The data input buffer 200 may generate the first and second output level detection signals CDN and CUP by performing the output level detection operation.

Since the data output enable signal DOEN is at a high level, the data input buffer 200 may generate the first and second output level detection signals CDN and CUP by comparing the voltage level of the data I/O unit 13 with the second reference voltage VREF2 and the third reference voltage VREF3.

As described above with reference to FIG. 5, since the data input enable signal DIEN is at a low level and the data output enable signal DOEN is at a high level, the data input buffer 200 may perform the output level detection operation by using the second current amount that is lower than the first current amount.

For example, when the data output enable signal DOEN is at a high level and the first output level detection signal CDN is at a high level, all the signal bits of the first impedance adjustment signal PCODE<0:N> may be changed to logic high, irrespective of the original values of the signal bits of the first impedance adjustment signal PCODE<0:N> as described above with reference to FIG. 3.

In this example, the first output level detection signal CDN with a high level means that the voltage level of the data I/O unit 13 is higher than the second reference voltage VREF2.

Since the second reference voltage VREF2 has a higher voltage level than the first reference voltage VREF1 that is used as a reference of the impedance adjustment operation, this means that the voltage level of the data I/O unit 13 has risen as opposed to being at a target level.

Accordingly, the output impedance of the data output buffer 300 may be increased to match the rise in the voltage level of the data I/O unit 13 by adjusting the value of the first impedance adjustment signal PCODE<0:N>.

As the number of signal bits of logic high among the signal bits of the first impedance adjustment signal PCODE<0:N> is increased, the number of PMOS transistors which turn off among the PMOS transistors 401-0 to 401-M may be increased as described above with reference to FIG. 8 and the impedance may be increased.

When the first output level detection signal CDN is at a high level, the second output level detection signal CUP may be at a low level. Accordingly, as described above with reference to FIG. 4, the value of the second impedance adjustment signal NCODE<0:N> may be maintained as the value determined through the impedance adjustment operation of the initialization process of the semiconductor apparatus 10.

For example, when the data output enable signal DOEN is at a high level and the second output level detection signal CUP is at a high level, all the signal bits of the second impedance adjustment signal NCODE<0:N> may be changed to logic high, irrespective of the original values of the signal bits in the second impedance adjustment signal NCODE<0:N> as described above with reference to FIG. 4.

For example, the second output level detection signal CUP with a high level means that the voltage level of the data I/O unit 13 is lower than the third reference voltage VREF3.

Since the third reference voltage VREF3 has a lower voltage level than the first reference voltage VREF1 that is used as the reference of the impedance adjustment operation, this means that the voltage level of the data I/O unit 13 is dropped as opposed to being at the target level.

Accordingly, the output impedance of the data output buffer 300 may be reduced to match the drop in the voltage level of the data I/O unit 13 by adjusting the value of the second impedance adjustment signal NCODE<0:N>.

As the number of signal bits of logic high among the signal bits of the second impedance adjustment signals NCODE<0:N> is increased, the number of NMOS transistors that turn on among the NMOS transistors 402-0 to 402-M may be increased as described above with reference to FIG. 9 and the impedance may be reduced.

When the second output level detection signal CUP is at a high level, the first output level detection signal CDN may be at a low level. Accordingly, as described above with reference to FIG. 3, the value of the first impedance adjustment signal PCODE<0:N> may be maintained as the value that is determined through the impedance adjustment operation of the initialization process of the semiconductor apparatus 10.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A semiconductor apparatus comprising:
    a data input buffer configured to generate write data by receiving data that is input through a data input/output (I/O) unit during a write operation section of the semiconductor apparatus and configured to generate an output level detection signal by detecting a voltage level of the data I/O unit during a read operation section of the semiconductor apparatus.

2. The semiconductor apparatus of claim 1, wherein the data input buffer operates by using a first current amount during the write operation section and operates by using a second current amount, lower than the first current amount, during the read operation section.

3. The semiconductor apparatus of claim 1, further comprising:
    a logic gate configured to output a data I/O enable signal as a logic operation result based on a data output enable signal and a data input enable signal;
    a first switch configured to couple a first current path of the data input buffer based on the data input enable signal; and a second switch configured to couple a second current path of the data input buffer based on the data I/O enable signal.

4. The semiconductor apparatus of claim 1, further comprising:
an impedance adjustment circuit configured to perform an impedance adjustment operation that adjusts a value of an impedance adjustment signal based on an impedance of an external resistor according to an impedance adjustment command during an initialization section and configured to perform an impedance readjustment operation that readjusts the value of the impedance adjustment signal based on the output level detection signal during the read operation section; and
a data output buffer configured to output read data through the data I/O unit by driving the read data with an output impedance that is determined based on the impedance adjustment signal.

5. A semiconductor apparatus comprising:
a data input buffer which includes:
a first multiplexer configured to select one of a first reference voltage and a second reference voltage based on a data output enable signal and configured to output the selected reference voltage; and
a first buffer configured to output write data by comparing a voltage level of a data input/output unit to a voltage level of the reference voltage that is output from the first multiplexer during an activation section of a data input enable signal and configured to output a first output level detection signal by comparing the voltage level of the data I/O unit to the voltage level of the reference voltage that is output from the first multiplexer during an activation section of the data output enable signal.

6. The semiconductor apparatus of claim 5, wherein the data input buffer further includes:
a logic gate configured to output a data I/O enable signal as a logic operation result based on the data output enable signal and the data input enable signal;
a first switch configured to couple a first current path of the first buffer based on the data input enable signal; and
a second switch configured to couple a second current path of the first buffer based on the data I/O enable signal.

7. The semiconductor apparatus of claim 6, wherein the data input buffer further includes:
a second multiplexer configured to select one of the first reference voltage and a third reference voltage based on the data output enable signal and output the selected reference voltage;
a second buffer configured to output the write data by comparing the voltage level of the data I/O unit to a voltage level of the reference voltage that is output from the second multiplexer during the activation section of the data input enable signal and configured to output a second output level detection signal by comparing the voltage level of the data I/O unit to the voltage level of the reference voltage that is output from the second multiplexer during the activation section of the data output enable signal;
a third switch configured to couple a first current path of the second buffer based on the data input enable signal; and
a fourth switch configured to couple a second current path of the second buffer based on the data I/O enable signal.

8. The semiconductor apparatus of claim 7, wherein a voltage level of the second reference voltage is higher than that of the first reference voltage, and a voltage level of the third reference voltage is lower than that of the first reference voltage.

9. The semiconductor apparatus of claim 5, further comprising:
an impedance adjustment circuit configured to perform an impedance adjustment operation that adjusts a value of an impedance adjustment signal based on an impedance of an external resistor according to an impedance adjustment command during an initialization section and configured to perform an impedance readjustment operation that readjusts the value of the impedance adjustment signal based on the first output level detection signal during a read operation section; and
a data output buffer configured to output read data through the data I/O unit by driving the read data with an output impedance that is determined based on the impedance adjustment signal.

10. A semiconductor apparatus comprising:
a data input buffer configured to generate write data by receiving data that is input through a data input/output (I/O) unit during a write operation section and configured to generate first and second output level detection signals by detecting a voltage level of the data I/O unit through read data during a read operation section;
an impedance adjustment circuit configured to perform an impedance adjustment operation that adjusts at least one value of the first and second impedance adjustment signals based on an impedance of an external resistor based on an impedance adjustment command during an initialization section and configured to perform an impedance readjustment operation that readjusts at least one value of the first and second impedance adjustment signals based on the first and second output level detection signals during the read operation section; and
a data output buffer configured to output the read data through the data I/O unit by driving the read data with an output impedance that is determined based on the first and second impedance adjustment signals.

11. The semiconductor apparatus of claim 10, wherein the data input buffer operates by using a first current amount during the write operation section and operates by using a second current amount, lower than the first current amount, during the read operation section.

12. The semiconductor apparatus of claim 10, wherein the data input buffer includes:
a first multiplexer configured to select one of a first reference voltage and a second reference voltage based on a data output enable signal and configured to output the selected reference voltage; and
a first buffer configured to output the write data by comparing a voltage level of the data I/O unit to a voltage level of the reference voltage that is output from the first multiplexer during an activation section of an data input enable signal and configured to output the first output level detection signal by comparing the voltage level of the data I/O unit to the voltage level of the reference voltage that is output from the first multiplexer during an activation section of the data output enable signal.

13. The semiconductor apparatus of claim 12, wherein the data input buffer further includes:

a logic gate configured to output a data I/O enable signal as a logic operation result based on the data output enable signal and the data input enable signal;
a first switch configured to couple a first current path of the first buffer based on the data input enable signal; and
a second switch configured to couple a second current path of the first buffer based on the data I/O enable signal.

14. The semiconductor apparatus of claim 13, the data input buffer further includes:
a second multiplexer configured to select one of the first reference voltage and a third reference voltage based on the data output enable signal and configured to output the selected reference voltage;
a second buffer configured to output the write data by comparing the voltage level of the data I/O unit to a voltage level of the reference voltage that is output from the second multiplexer during the activation section of the data input enable signal and configured to output the second output level detection signal by comparing the voltage level of the data I/O unit to the voltage level of the reference voltage that is output from the second multiplexer during the activation section of the data output enable signal;
a third switch configured to couple a first current path of the second buffer based on the data input enable signal; and
a fourth switch configured to couple a second current path of the second buffer based on the data I/O enable signal.

15. The semiconductor apparatus of claim 10, wherein the impedance adjustment circuit includes:
a first comparator configured to compare a voltage of a first node that is coupled to an external resistor pad to the first reference voltage and configured to output a comparison result during an activation section of an operation control signal;
a first counter configured to adjust the value of the first impedance adjustment signal by performing up/down counting based on an output of the first comparator;
a first adjuster configured to readjust the value of the first impedance adjustment signal based on a data output enable signal and the first output level detection signal;
a first digital-analog converter (DAC) configured to convert the first impedance adjustment signal to an analog voltage level and configured to apply the analog voltage level to the first node;
a second comparator configured to compare the first reference voltage to a voltage of a second node and configured to output a comparison result during the activation section of the operation control signal;
a second counter configured to adjust the value of the second impedance adjustment signal by performing up/down counting based on an output of the second comparator;
a second adjuster configured to readjust the value of the second impedance adjustment signal based on the data output enable signal and the second output level detection signal;

a second DAC configured to convert the first impedance adjustment signal to an analog voltage level and configured to apply the analog voltage level to the second node; and
a third DAC configured to convert the second impedance adjustment signal to an analog voltage level and configured to apply the analog voltage level to the second node.

16. The semiconductor apparatus of claim 15, wherein the impedance adjustment circuit further includes:
a controller configured to generate a plurality of internal commands, which define performing of the impedance adjustment operation in response to the impedance adjustment command that is generated in the initialization section; and
a timer counter configured to generate the operation control signal, which sets impedance adjustment operation times that correspond to the plurality of internal commands by using a clock signal.

17. The semiconductor apparatus of claim 15, wherein the first adjuster includes:
a first logic gate configured to perform a logic AND operation on the data output enable signal and the first output level detection signal and configured to output a logic AND operation result; and
a plurality of second logic gates configured to perform logic OR operations on signal bits of the first impedance adjustment signal and an output signal of the first logic gate, bit by bit, and configured to output logic OR operation results.

18. The semiconductor apparatus of claim 15, wherein the second adjuster includes:
a first logic gate configured to perform a logic AND operation on the data output enable signal and the second output level detection signal and configured to output a logic AND operation result; and
a plurality of second logic gates configured to perform logic OR operations on signal bits of the second impedance adjustment signal and an output signal of the first logic gate, bit by bit, and configured to output logic OR operation results.

19. The semiconductor apparatus of claim 10, wherein the data output buffer includes:
a pre-pull-up driver configured to generate a pull-up control signal by driving the read data based on the first impedance adjustment signal;
a pre-pull-down driver configured to generate a pull-down control signal by driving the read data based on the second impedance adjustment signal;
a main pull-up driver configured to drive the data I/O unit with an impedance that is determined based on the pull-up control signal; and
a main pull-down driver configured to drive the data I/O unit with an impedance that is determined based on the pull-down control signal.

* * * * *